United States Patent [19]

Glazer

[11] Patent Number: 4,513,386
[45] Date of Patent: Apr. 23, 1985

[54] RANDOM BINARY BIT SIGNAL GENERATOR

[75] Inventor: Sydney Glazer, San Diego, Calif.
[73] Assignee: NCR Corporation, Dayton, Ohio
[21] Appl. No.: 442,709
[22] Filed: Nov. 18, 1982
[51] Int. Cl.$^3$ ............................................. H03B 29/00
[52] U.S. Cl. ................................................. 364/717
[58] Field of Search ........................... 364/717; 331/78
[56] References Cited

U.S. PATENT DOCUMENTS

| | | | |
|---|---|---|---|
| 3,612,845 | 10/1971 | Lawlor ................................. | 364/717 |
| 4,176,399 | 11/1979 | Hoffmann et al. ................... | 364/717 |
| 4,183,088 | 1/1980 | Simmons ............................. | 364/717 |

OTHER PUBLICATIONS

Vincent, "The Generation of Truly Random Binary Numbers", *J. of Physics E: Scientific Instrum.*, 1970, vol. 3, pp. 594–598.
Maddocks et al., "A Compact & Accurate Generator for Truly Random Binary Digits", *J. of Physics E. Scientific Instruments*, 1972, vol. 5, No. 6, pp. 542–544.
Sokal, "Optimum Choice of Noise Freq. Band & Sampling Rate for Generation Random Binary Digits from Clipped White Noise *IEEE Trans. on Computers*, Jun. 1972, pp. 614–615.

*Primary Examiner*—David H. Malzahn
*Attorney, Agent, or Firm*—J. T. Cavender; Edward Dugas; Donald P. Gillette

[57] ABSTRACT

A random sequence of 1's and 0's is generated by detecting excursions of a random noise signal above a certain positive voltage level, below a certain negative voltage level, and into an intermediate voltage range between the positive and negative levels. A 1 bit is generated each time the random signal shifts to a value above the first level and then into the intermediate range, where it must remain long enough to coincide with a clock signal. A 0 bit is generated each time the random signal becomes more negative than the second level and then shifts back into the intermediate range and remains there long enough to coincide with one of the clock signals. A signal generated at the end of each bit signal is used to clock that bit into a shift register. The same clocking signal also causes a counter to count a predetermined number of random bit signals and then to output the information stored in the shift register to a data bus for use as a random number signal.

12 Claims, 3 Drawing Figures

RANDOM BINARY BIT SIGNAL GENERATOR

BACKGROUND OF THE INVENTION

This invention relates to the field of electronic generation of bit signals in a random order of 1's and 0's, which may be used in that form or transferred to another numerical base, such as the base ten.

It is desirable to be able to generate random numbers for use in computers, for example as part of an encryption procedure. Many circuits operate on the basis of feedback of information from one or more output terminals to one or more input terminals in a shift register, but the generation of numbers in such circuits, while apparently random, is not entirely so. The numbers so generated are usually referred to as pseudorandom numbers. Other circuits generate or use random signals, essentially noise signals, to generate more nearly truly random numbers.

U.S. Pat. No. 3,612,845 to Lawlor describes the generation of random binary numbers by sampling the magnitude of the output signal of a random noise source. The samples constitute a regularly occurring train of pulses of random amplitude. The pulse train is passed through a threshold circuit and all pulses above the threshold levels are deemed to correspond to 1's, while all those below the threshold are deemed to constitute 0's. Since all of the bits are generated by direct interaction of the clock signal with the noise signal, the transition from a 1 to a 0 would be dependent upon the rate of change of the noise signal, and any slowing down of the rate of change, as for example by passing the signal through a low pass filter, which Lawlor does, would lead to a tendency to generate a plurality of successive bits of the same type and would violate one of the fundamental requirements of a true random binary number generator: no matter whether a given bit is a 1 or a 0, the probability that the next bit will be a 1 is equal to the probability that it will be a 0.

U.S. Pat. No. 3,848,586 to Suzuki describes a system that utilizes signals similar to random signals but does not do so for the purpose of providing a random sequence of 1's and 0's.

U.S. Pat. No. 4,183,088 to Simmons describes the generation of a random sequence of 1's and 0's by generating pulses of random width and sampling them at regular intervals. The number of sampling pulses in each random width pulse is either odd or even and that fact is used to determine whether the random width pulse constitutes a 1 or a 0.

U.S. Pat. No. 4,327,419 to Deutsch et al. describes the utilization of a noise signal as a basis for generating a musical signal but not a random number sequence.

It is an object of the invention to provide a circuit for generating electrical signals representing 1's and 0's in random order.

Another object is to provide a method for generating random-order bit signals.

A further object is to generate random-order 1 and 0 bit signals without generating detectable ambiguous signals, each representative of both 1 and 0.

Briefly, the present invention is directed to a random number signal generator comprising: means to generate a random amplitude signal; first means to determine when the random amplitude signal has made an excursion farther in one polarity from a zero value than a first level and then has returned to an intermediate range closer to the zero value than the first level to generate a signal having a first binary value; and second means to determine when the random amplitude signal has made an excursion farther in the opposite polarity from the zero value than a second level and has returned to the intermediate range to complete the generation of a signal having a second binary value.

In accordance with the present invention, a random sequence of 1's and 0's is generated by utilizing the output signal of a noise generator. The amplitude of this signal varies randomly above a predetermined positive level and below a predetermined negative level, and each excursion of the voltage beyond the respective levels is detected in first and second detectors, respectively. The random noise signal is also detected in a third detector when it is within an intermediate range between the two levels just mentioned. The purpose of detecting that the amplitude of the random signal has reached the positive level and has subsequently diminished to the intermediate range is that both of those events must occur in that sequence to generate a signal arbitrarily designated as a 1. The occasions when the signal randomly becomes more negative than the negative level, so as to actuate the second detector, and thereafter returns to the intermediate range are designated as 0's. The output of the first detector when the signal exceeds the positive voltage bound sets a first flip-flop arbitrarily designated as the 1's flip-flop, and it remains set until a reset voltage is produced when the random signal thereafter returns to the intermediate range. In the same manner, a 0's flip-flop is set by the output of the second detector when the random signal becomes more negative than the predetermined negative bound, and this flip-flop remains set until the random signal returns to the intermediate range.

In order to correlate some part of the signals representing 1's and 0's at the outputs of the two flip-flops with a clock signal, such as is utilized in a computer, the signal generated when the random signal is within the intermediate range is applied to a D-type flip-flop that is clocked by the clock signal. The output of the latter flip-flop circuit is combined with the clock signal to generate the reset signal as a series of pulses corresponding to the clock pulses that occur during the time the random signal is within the intermediate range. It is the first of these reset pulse signals that resets the 1's flip-flop and the 0's flip-flop, according to which one of them is in the set condition at the time the reset signal is generated.

It is possible for the random signal to change so rapidly that it passes through the intermediate band between successive clock pulses, and in that case, it would be possible for the 1's flip-flop to be still set when the 0's flip-flop is set. As a result, the output signals of these two flip-flops cannot be used directly to indicate whether a 1 or a 0 has been generated, and in order to eliminate this ambiguous condition, the outputs of the two flip-flops are applied to an Exclusive OR gate, which allows an output signal to pass through only when the two input signals are of different value, indicating that one of the flip-flops is set and the other is not. By making the clock signal have a high repetition rate, it is inevitable that the signal will eventually be in the intermediate range long enough to be coincident with at least one clock pulse so as to generate at least one reset pulse, which is all that is required to reset either or both the 1's flip-flop and the 0's flip-flop.

The 1's and 0's are accumulated in the order in which they are generated, after removal of the previously mentioned ambiguity, by clocking each of them into a shift register. Since the clocking has to have the same degree of randomness as the rate at which the 1 and 0 bits are generated, the random bit clock signal is produced at the completion of each bit generation, whether it is a 1 bit or a 0 bit. This random bit clock signal is then used to clock the output of one of the flip-flops, either the 1's flip-flop or the 0's flip-flop, into a shift register. It is unnecessary to clock both of the flip-flops, because at the time of clocking, the signal being clocked in will either be present or not. If it is the output of the 1's flip-flop that is being clocked in, a signal present in its output at the time of clocking will be a 1's signal. When a clock signal is generated during the production of a 0 signal in the 0's flip-flop, there will be no output from the 1's flip-flop, and this condition will be clocked into the shift register as a 0.

In order to transfer the random sequence of 1's and 0's out of the shift register, the random bit clock signal may be applied to a counter to count a suitable number of pulses which can be read by a microprocessor. At a suitable count, the microprocessor can then generate a signal to be applied to the shift register to transfer the existing bits to a data bus. At the same time, the counter is returned to its initial condition to begin a new count. In this way, the random sequence of 1's and 0's in the shift register at the time they are transferred out can be transformed into a decimal signal by applying a sequence of four such bit signals to a binary-to-decimal converter.

DETAILED DESCRIPTION OF A PREFERRED EMBODIMENT

Figure 1:
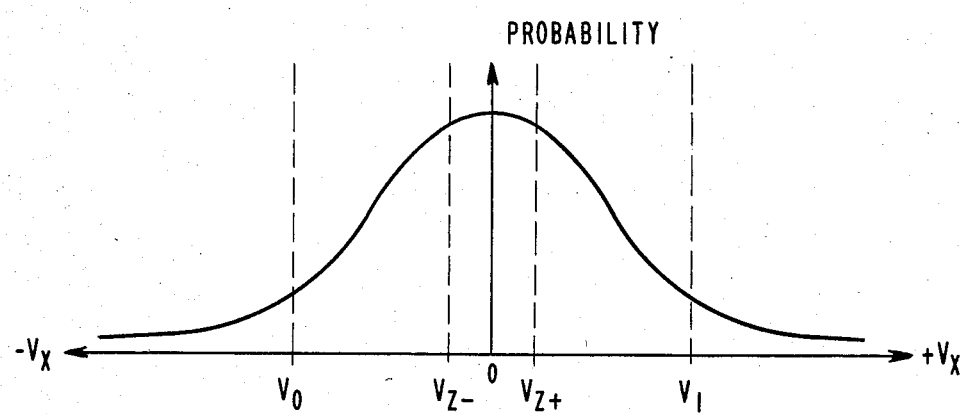
FIG. 1 is a probability curve representing the probability that the random signal generator will have any given amplitude.

In FIG. 1, the abscissa represents a voltage $V_X$ that has a random Gaussian distribution. Four voltage levels have been arbitrarily designated. These include $V_1$, which is the positive bound to be used in determining the occurrence of 1's, the negative voltage $V_0$, which is to be used in determining the occurrence of 0's, and the voltages $V_{Z+}$ and $V_{Z-}$ that determine the positive and negative extent of an intermediate voltage range between $V_1$ and $V_0$. The voltage value 0 corresponds to the maximum probability and represents the mean value of the voltage of a random signal generator. At any instant, the random voltage is equally likely to be positive or negative with respect to the 0 value. In order to make it equally likely that a 1 bit or a 0 bit will be generated, the value of the voltage $V_0$ should be equal to the negative value of the voltage $V_1$, assuming the probability curve is symmetrical about the 0 level. For the same reason, the voltages $V_{Z+}$ and $V_{Z-}$ should be symmetrically located about the 0 value.

The values for $V_{Z+}$ and $V_{Z-}$ must be within the bounds defined by $V_1$ and $V_0$, but in addition, it is desirable that the range represented by $V_{Z+}$ and $V_{Z-}$ should be relatively close to 0, and it may even be equal to 0, so that the random voltage will have to change by a substantial amount after it either exceeds the positive bound $V_1$ or the negative bound $V_0$ in order to complete the condition required to generate a 1 bit or a 0 bit, respectively. If the voltages $V_{Z+}$ and $V_{Z-}$ were relatively close to $V_1$ and $V_0$, respectively, the random voltage could chatter about a small range close to $V_1$ or $V_0$ and still enter the intermediate range between $V_{Z+}$ and $V_{Z-}$, thereby completing the conditions necessary to generate a large number of 1's or 0's in succession. Such a possibility is diminished by requiring the transition of voltage to be large, but that in no way diminishes the randomness of generating 1's and 0's, and it is perfectly possible to generate any number of 1's in succession or any number of 0's in succession, as would be a necessary condition for the generated sequence to be truly random. The probability of generating a large number of bits of the same type in succession diminishes with the number of such similar bits, as is also required if the bits are to be truly random. However, any single bit, whether a 0 bit or a 1 bit, is equally likely to be followed by either a 0 bit or a 1 bit.

Figure 2:
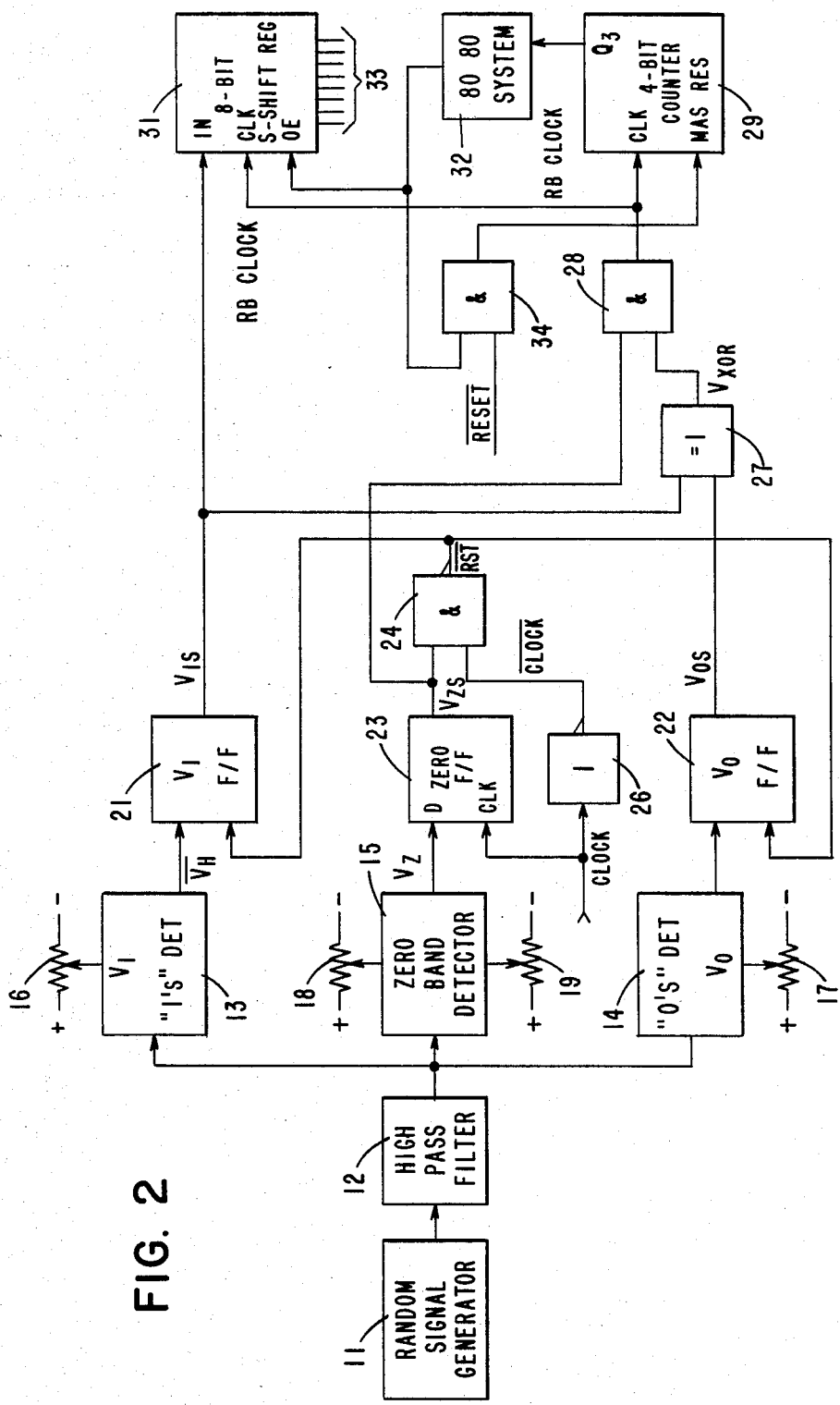
FIG. 2 is a block diagram of a random number generator in accordance with the present invention.

The circuit to accommodate the concept just described is shown in FIG. 2, and includes a random signal generator 11, such as a noise signal generator that produces an output signal, the amplitude of which shifts at random over a predetermined range. The output signal of the generator 11 is passed through a high pass filter 12 to remove any possible DC component and is applied to three detectors 13–15. The detector 13 is referred to as the 1's detector and for illustration purpose is shown connected to a level setting potentiometer 16 that determines the level $V_1$ but may be accomplished by other means. The detector 14 is referred to as the 0's detector and is connected to another level setting potentiometer 17 to set the voltage level $V_0$ but may be accomplished by other means than a potentiometer. The detector 15 is an intermediate range detector, but since this range is preferably close to the zero voltage value, the detector 15 is referred to as the zero-band detector and is connected to two level-setting potentiometers 18 and 19, which may also be accomplished by means other than potentiometers, to set the levels $V_{Z+}$ and $V_{Z-}$, respectively.

The 1's detector 13 has an output terminal from which a voltage $V_H$, is connected to the setting terminal of a $V_1$ flip-flop 21. Similarly, the 0's detector has an output terminal from which a voltage $V_L$ is connected to the setting terminal of a $V_0$ flip-flop 22. The 0 band detector 15 has an output terminal from which a voltage $V_Z$ is connected to the D terminal of a D-type flip-flop 23. The latter flip-flop has a clock input terminal to which a clock pulse signal is applied to clock the value of the D terminal to an output terminal at the rise of the clock signal, where it appears as a voltage $V_{ZS}$. This output terminal is connected to one of the input terminals of a NAND gate 24. The clock signal applied to the clock input terminal of the flip-flop 23 is inverted in an inverter 26 and applied to the other input terminal of the NAND gate 24, and the output terminal of the NAND gate is connected to the reset terminals of both of the flip-flops 21 and 22.

The flip-flop 21 has an output terminal from which a voltage $V_{1S}$ is obtained and connected to one of the input terminals of an Exclusive OR gate 27. The flip-flop 22 has an output terminal from which a signal $V_{OS}$ is obtained and connected to a second input terminal of the Exclusive OR gate 27. The output terminal of the Exclusive OR gate is connected to one input terminal of an AND gate 28, and the other input of the AND gate is connected to the output terminal of the flip-flop 23 to receive the voltage $V_{ZS}$.

The output terminal of the AND gate 28, from which a random bit clock signal is derived, is connected to the clock input terminal of a 4-bit counter 29 and to the clock signal input terminal of a shift register 31. In this embodiment, the output terminal of the flip-flop 21 from which the signal $V_{1S}$ is obtained is connected to the input terminal of the shift register.

The 4-bit counter 29 has an output terminal connected by means illustrated in this embodiment as an 8080 system to a control terminal of the shift register to shift the signal on the shift register to a data bus 33. The 8080 system 32 also is connected to an AND gate 34 that is normally enabled as long as the system is in operation. The output of the AND gate 34 is connected to a master reset terminal of the 4 bit counter 29, which provides the means to reset the four bit counter to zero whenever random data is shifted onto the data bus.

The operation of the circuit in FIG. 2 will be described in greater detail in conjunction with the voltage waveforms shown in FIG. 3.

Figure 3:
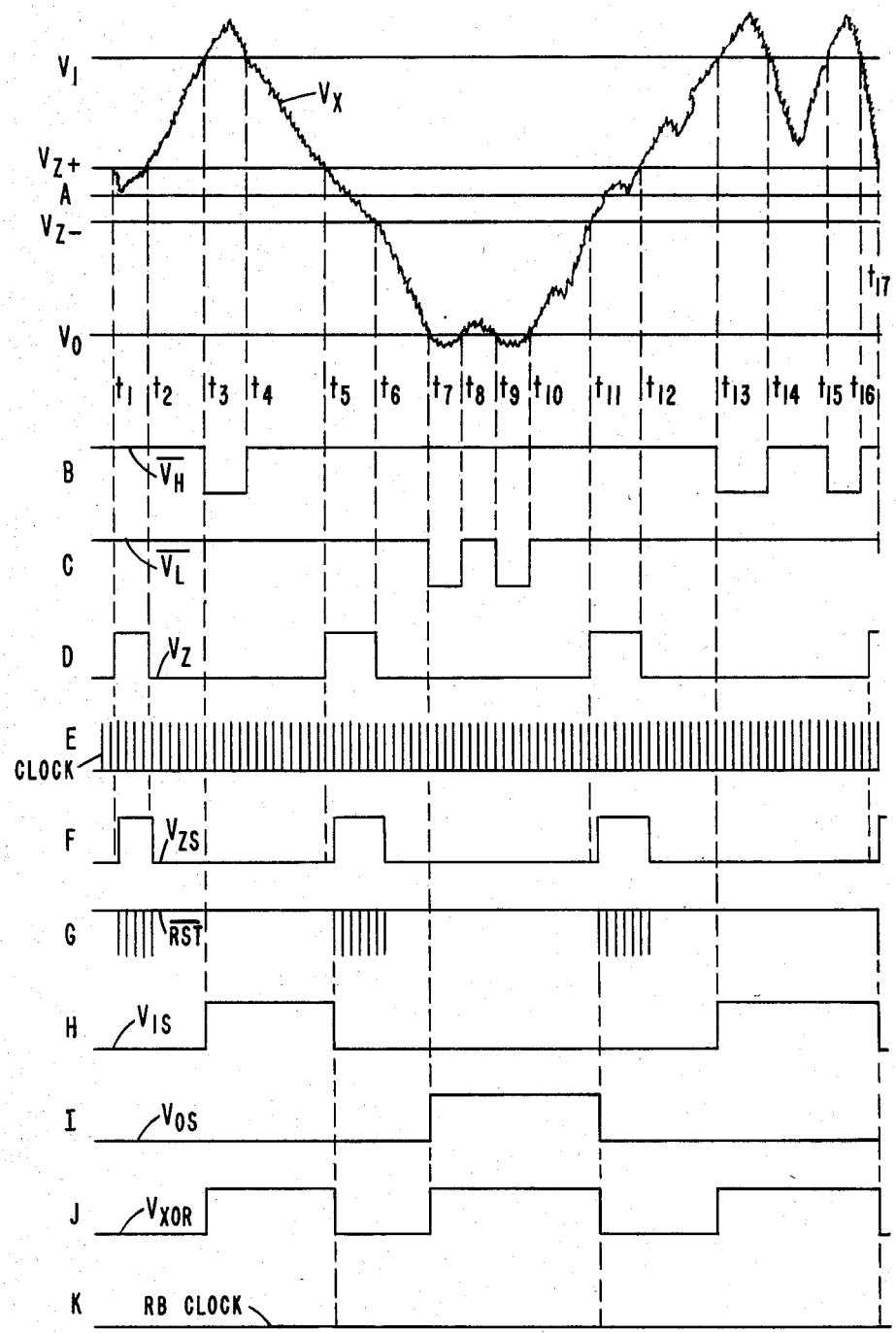
FIG. 3 shows a series of related waveforms indicative of conditions in the random number generator of FIG. 2.

A typical random voltage $V_X$ is shown in FIG. 3 as waveform A and may be considered to be the output of the generator 11, or, since the voltage $V_X$ has no DC component, it may be considered to be the output of the high pass filter 12. Positive and negative voltage levels $V_1$ and $V_0$, which are of equal magnitude, are indicated in waveform A and are chosen so that the voltage $V_X$ occasionally exceeds the positive voltage $V_1$ and occasionally exceeds the negative level $V_0$ by becoming more negative than the negative voltage $V_0$. Waveform A in FIG. 3 also shows an intermediate voltage range bounded by $V_{Z+}$ and $V_{Z-}$. It is preferable that $V_{Z+}$ be substantially less positive than $V_1$ and that $V_{Z-}$ be substantially less negative than $V_0$, but there is no fixed relationship between the magnitude of $V_{Z+}$ and $V_1$ nor between the magnitude of $V_{Z-}$ and $V_0$. Since $V_{Z+}$ and $V_{Z-}$ are preferably relatively close to the zero voltage level, the voltage range between them is therefore referred to as the zero band.

The output voltage $V_H$ of the detector 13 is illustrated in waveform B in FIG. 3, which shows that each time the random voltage $V_X$ in waveform A exceeds the value $V_1$, the output voltage of the 1's detector 13 drops from 1 to 0. The detector 13 is caused to produce these output pulses between the times $t_3$ and $t_4$, the times $t_{13}$ and $t_{14}$, and the times $t_{15}$ and $t_{16}$ in waveform B, but these times are entirely dependent on the random variation of the amplitude of the signal $V_X$.

Similarly, the output voltage $V_L$ of the 0's detector 14 drops from 1 to 0 each time the voltage $V_X$ becomes more negative than the volta $V_0$, as it does from the time $t_7$ to the time $t_8$ and from the time $t_9$ to the time $t_{10}$, as shown in waveform C in FIG. 3.

The zero band detector 15 produces an output signal $V_Z$, as shown in waveform D in FIG. 3. During intervals when the voltage $V_X$ is more negative than the voltage $V_{Z+}$ but more positive than the voltage $V_{Z-}$, the output voltage of the detector 15 goes from 0 to 1. This is true during the intervals between the times $t_1$ and $t_2$, the times $t_5$ and $t_6$, the times $t_{11}$ and $t_{12}$ and the time following $t_{17}$.

The output voltage $V_Z$ of the zero band detector 15 is applied to the D input terminal of the D-type flip-flop 23, which is supplied with a steady clock signal CLOCK, shown in waveform E in FIG. 3, at its clock input terminal. The clock signal transfers to the output terminal of the zero flip-flop 23 the voltage existing on its D terminal at the rise time of the clock pulse, as illustrated by the signal $V_{ZS}$ in waveform F in FIG. 3. As a result, the leading and lagging edges of each of the pulses of the signal $V_{ZS}$ at the output terminal of flip-flop 23 are not precisely coincident with the leading and lagging edges of the rectangular wave signal $V_Z$ applied to the D terminal, but are delayed sufficiently to coincide with the first pulse occurring after each of the leading and lagging edges of the rectangular signal $V_Z$.

The signal $V_{ZS}$ from the flip-flop 23 and an inverted clock signal $\overline{CLOCK}$, which is produced by passing the clock signal through the inverter 26, are applied to input terminals of the NAND gate 24 to produce a reset signal $\overline{RST}$ shown in waveform G in FIG. 3. During intervals when either the $\overline{CLOCK}$ signal or the signal $V_{ZS}$ is low, the reset signal $\overline{RST}$ is high but the reset signal is driven low when both the input signals $V_{ZS}$ and $\overline{CLOCK}$ are high. As a result, the reset signal $\overline{RST}$ is in the form of groups of negative going pulses that extend downwardly from the resting level that has a value of 1 during intervals between the positive pulses in the signal $V_{ZS}$. The first reset pulse $\overline{RST}$ in each group of such pulses resets whichever one of the flip-flops 21 or 22 was previously set, if either of them were.

It happens that the random signal $V_X$ depicted in waveform A in FIG. 3 produces, in the interval illustrated, two excursions of the output signal $V_{1S}$ of the flip-flop 21 and one excursion of the output signal $V_{OS}$ of the flip-flop 22. The signals $V_{1S}$ and $V_{OS}$ are illustrated in waveforms H and I, respectively, combined in the Exclusive OR gate 27 to produce the output signal $V_{XOR}$ shown in waveform J in FIG. 3. This signal has three pulses during the interval illustrated, the first one representing a 1, the second a 0, and the third a 1. As has been described, in this embodiment of the invention the leading edges of these three pulses occur at indeterminate times relative to the clock signal, but the trailing edges are all produced in synchronism with clock pulses. Furthermore, the times of occurrence of each of the trailing edges of the three pulses in the $V_{XOR}$ signal are substantially contemporaneous with the trailing edges of individual clock pulses. On the other hand, the leading edges of the $V_{ZS}$ signals produced by the flip-flop 23 are substantially contemporaneous with the leading edges of the same clock pulses. Thus, there is a very short overlap, approximately equal in length to one of the clock pulses, between each of the three pulses in the output signal $V_{XOR}$ of the Exclusive OR gate 27 and three of the pulses $V_{ZS}$ of the flip-flop 23. By applying the output signal $V_{ZS}$ of the flip-flop 23 to one input of the AND gate 28 and applying the output of the Exlusive OR gate 27 to the other input terminal of the AND gate 28, short pulses, identified as RB CLOCK pulses, are produced. The RB CLOCK signal is illustrated in waveform K in FIG. 3. Each RB CLOCK pulse has a duration substantially equal to one of the clock pulses in waveform E and each of the RB CLOCK pulses occurs substantially simultaneously with one of the clock pulses applied to the clock input terminal of the flip-flop 23, but the interval between successive RB CLOCK pulses can vary widely. What is essential is that each RB CLOCK pulse occurs during the generation of a bit signal, which may be either a 1 bit, constituted by one of the pulses in the signal $V_{1S}$ in waveform H, or a 0 bit, constituted by one of the pulses in the signal $V_{OS}$ in waveform I.

Information corresponding to the randomly generated sequence of 1 bit pulses $V_{1S}$ and 0 bit pulses $V_{OS}$ is accumulated in a shift register 31, which is illustrated as being an 8-bit shift register. To do this a clock signal must also be applied to the clock input terminal of that shift register, and the clock signal must occur, not at regular intervals, but invariably during the time one of the bit signal pulses is being applied. This clocking condition is met by the random bit clock signal RB CLOCK. It is not appropriate to clock in the output bit signals $V_{XOR}$ of the Exclusive OR gate 27, because both the 1 bits and the 0 bits are represented at that point in the circuit by positive pulses and would be clocked into the shift register 31 as a series of 1's, even though some of them should be 0's.

In order to distinguish between 1's and 0's when bits are being clocked into the shift register 31, the output of one of the flip-flops 21 or 22 is applied to the input terminal of the shift register. In this embodiment, it is the output of the flip-flop 21. Thus, only the 1's represented by the signal $V_{1S}$ are applied to the input terminal of the shift register 31. However, the random bit clock signal occurs not only during each of the 1 bits but also during each 0 bit signal. In the conditions illustrated in FIG. 3, the RB CLOCK signal would clock the two pulses represented in the $V_{1S}$ signal into the shift register 31 as 1's and would clock in the zero condition between those 1's at a time coincident with the last portion of the zero bit signal $V_{OS}$ from the flip-flop 22. Thus, the clocking occurring between 1 bit signals would result in the equivalent of a 0 bit being clocked into the shift register 31 so that, at each clocking, the shift register would have either a 1 bit or a 0 bit clocked into it.

The output signals $V_{1S}$ and $V_{OS}$ of the flip-flops 21 and 22 are illustrated in waveforms H and I, respectively in FIG. 3. As illustrated, the pulses in the signals $V_{1S}$ and $V_{OS}$ are separate in time and do not overlap each other. This is customary in the operation of the circuit in FIG. 2, but a condition can exist in which both of the flip-flops 21 and 22 are set during the same interval of time. This can occur if the random signal $V_X$ passes through the zero band between $V_{Z+}$ and $V_{Z-}$ so quickly that, although a short pulse $V_Z$ will be generated, it will be so short as to be terminated before even one clock pulse can occur. If each pulse in the output signal $V_{1S}$ of the flip-flop 21 were simply treated as a 1 signal, and each pulse in the output signal $V_{OS}$ of the flip-flop 22 were treated as a 0 signal, the possibility that both of these flip-flops could be set simultaneously would mean that both a 1 and a 0 were being generated simultaneously, which would be ambiguous and therefore unacceptable in producing a random number.

In order to eliminate the ambiguity, the output signal $V_{1S}$ from the flip-flop 21 and the output signal $V_{OS}$ from the flip-flop 22 are applied to the two input terminals of the Exclusive OR gate 27. The nature of an Exclusive OR gate is such that it can produce an output signal only if the input signals are different, one being a 1 and the other a 0. As a result, there is no output from the Exclusive OR gate 21 during intervals between the generation of an output signal from either of the flip-flops 21 or 22, and there would also be no output signal from the Exclusive OR gate 27 when both of the flip-flops 21 and 22 were set during the same interval of time. It is not to be expected that the random signal $V_X$ would continue for long without remaining in the band between the voltages $V_{Z+}$ and $V_{Z-}$ long enough to coincide with one of the clock pulses and thereby generate a reset signal $\overline{RST}$, which would reset both of the flip-flops 21 and 22 and eliminate the potentially ambiguous condition. However, the Exclusive OR gate 27 makes certain that the ambiguous condition cannot be propagated farther along the system.

Furthermore, although in a case of an overlapping interval during which both flip-flops 21 and 22 were set, one of them would necessarily be set first and would cause the Exclusive OR gate 27 to go high. However, the output of the Exclusive OR gate would be driven low as soon as the other flip-flop was set at the start of the overlap. It is important to note that, since no $\overline{RST}$ signal would have occurred while the output of the Exclusive OR gate was high, no RB CLOCK pulse would have been generated, so no bit signal would have been clocked into the shift register 31. The next $\overline{RST}$ signal would reset both flip-flops 21 and 22, but since the output $V_{XOR}$ of the Exclusive OR gate 27 would already be low, there would be no overlapping high condition to be transmitted through the AND gate 28 as an RB CLOCK pulse. Thus, there would be no erroneous clocking of either a 0 bit or a 1 bit into the shift register during a period of ambiguity.

The randomly generated 1's and 0's constitute a random binary number. This number can be transformed into a random number of another base by accumulating the binary bits in the shift register 31. Since the shift register 31 has only a finite number of storage locations, it is necessary to transfer the signal out of it from time to time onto a data bus 33 for further use as a random number signal. The transferring out of the signal temporarily stored on the shift register 31 is accomplished by the 4-bit counter 29 which can count to 15 after being reset. This counter has the RB CLOCK signal applied to its clock input terminal, and it counts eight of these random bit clock pulses and then generates an output signal on the terminal $Q_3$. This terminal is connected to a resetting circuit, which is illustrated as an 8080 system, but which simply results in generating a negative-going pulse to be applied to one of the input terminals of the AND gate 34 and transferred through the AND gate to the master reset input terminal of the counter 29. The other input signal to the AND gate 34 is a $\overline{RESET}$ signal generated when the whole system is put into operation and maintained at a constant high level as long as the system continues in operation. Thus, if the system is turned on in the morning and turned off at night, it is to be expected that the $\overline{RESET}$ would have the value 1 from morning until night. The same negative-going pulse produced by the 8080 system to operate as a master reset signal for the 4-bit counter is also applied to an output enable terminal of the shift register 31 to transfer the 8-bit signal recorded thereon to the data bus 33 for use as a random number signal in any apparatus connected to that bus.

While this invention has been described in terms of specific operation of a specific embodiment, it will be recognized by those skilled in the art that modifications may be made therein within the true scope of the invention.

I claim:
1. A random number signal generator comprising:
   means to generate a random amplitude signal;
   first detector means to determine when the random amplitude signal has made an excursion farther in one polarity from a zero value than a first level and then has returned to an intermediate range closer to the zero value than the first level to generate a signal having a first binary value; and second detector means to determine when the random amplitude signal has made an excursion farther in the opposite polarity from the zero value than a second level and has returned to the intermediate range to complete the generation of a signal having a second binary value.

2. The random number signal generator of claim 1, comprising:
a third detector means to detect when the random amplitude signal is within the intermediate range between the first and second levels.

3. The random number signal generator of claim 2, in which said first detector means includes a bistable circuit to be placed in a first stable condition when the value of the random amplitude signal is more positive than the first level, said bistable circuit being connected to said third detector means to be shifted to a second stable condition when the amplitude of the random amplitude signal is within the intermediate range.

4. The random number signal generator of claim 3, in which said second detector means includes a bistable circuit to be placed in a first stable condition when the amplitude of the random amplitude signal is more negative than the second level, said second bistable circuit being connected to said third detector means to be placed in a second stable condition when the amplitude of the random amplitude signal is within the intermediate range.

5. The random number signal generator of claim 2, in which said first and said second detector means includes bistable circuits, and said third detector means further includes, a resetting signal generator to be actuated when the amplitude of the random amplitude signal is within the intermediate range, said resetting signal generator being connected to both of said bistable circuits to supply resetting signals to return both of said bistable circuits to a condition representative of the random amplitude signals being in the intermediate range.

6. The random number signal generator of claim 5, in which said resetting signal generator comprises a further bistable circuit and a means to supply clock signals thereto, said further bistable circuit being placed in a first stable condition in response to the first of the clock signals folliwng detection of the amplitude of the random amplitude signal being within the intermediate range, said further bistable circuit being returned to a second stable condition in reseponse to the first of the clock signals to be applied thereto following detection of the amplitude of the random amplitude signal being outside of the intermediate range.

7. The random number signal generator of claim 6 in which said resetting signal generator further comprises gate means connected to an output circuit of said further bistable circuit to receive a signal therefrom representative of the first and second stable conditions, in sequence, of the further bistable circuit, said gate means also being connected to receive the clock signals to produce, at the output circuit of said gate means, a resetting comprising replicas of the clock signals during intervals of time when the amplitude of the random amplitude signal is within the intermediate range.

8. The random number signal generator of claim 7, comprising, in addition, an Exclusive OR gate connected to outputs of said first and said second bistable circuits to transmit nonoverlapping output signals from said first and said second bistable circuits when either of said first and said second bistable circuits is in its first bistable condition.

9. The random number signal generator of claim 8, comprising, in addition, an AND gate having a first input circuit connected to the output of said Exclusive OR gate and a second input connected to an output of said further bistable circuit to generate a random bit signal during an overlapping interval at the end of each output signal from said Exclusive OR gate coincident with the initial part of the output signal of said further bistable circuit when the latter is placed in its first stable condition.

10. The random number signal generator of claim 9, comprising, in addition:
a shift register connected to one of said first and said second bistable circuits to receive output signals therefrom and comprising, a clock signal input terminal connected to the output of said AND gate to receive random bit clock signals therefrom during each unambiguous output signal from either of said first and said second bistable circuits to clock the output signals from one of said first and said second bistable circuits into said shift register; and
a counter circuit connected to said AND gate to receive the random bit clock signals therefrom, said counter circuit being connected to said shift register to supply an output enable signal thereto after counting a predetermined number of the random bit clock signals.

11. The method of generating random number signals comprising the steps of:
generating a random amplitude signal having an amplitude that varies randomly about a zero value;
measuring each excursion of the amplitude of the random amplitude signal to a value more positive than a first positive level, followed by return of the amplitude of the random amplitude signal to a range of amplitudes closer to zero than the first level, the excursion and return constituting a first binary value; and
measuring each excursion of the amplitude of the random amplitude signal to a value more negative than a second level, negative with respect to the zero value, followed by return of the amplitude of the random amplitude signal to the intermediate range, said last-named excursion and return constituting a second binary value, said first and second excursions occurring in random order.

12. The method of claim 11 in which the first and second levels are of equal magnitude and opposite polarity relative to zero, and the range of amplitudes is bounded by values of equal magnitude and opposite polarity relative to zero.

* * * * *